United States Patent
Naveh et al.

(10) Patent No.: US 11,995,515 B2
(45) Date of Patent: May 28, 2024

(54) DAG-BASED CSP QUANTUM CIRCUIT MODELING

(71) Applicant: Classiq Technologies LTD., Tel Aviv (IL)

(72) Inventors: Yehuda Naveh, Tel Aviv-Jaffa (IL); Amir Naveh, Haifa (IL); Nir Minerbi, Haifa (IL); Ofek Kirzner, Haifa (IL); Adam Goldfeld, Kiryat Motzkin (IL); Shmuel Ur, Shorashim (IL)

(73) Assignee: CLASSIQ TECHNOLOGIES LTD., Tel Aviv (IL)

( * ) Notice: Subject to any disclaimer, the term of this patent is extended or adjusted under 35 U.S.C. 154(b) by 0 days.

(21) Appl. No.: 18/171,785

(22) Filed: Feb. 21, 2023

(65) Prior Publication Data
US 2023/0196153 A1  Jun. 22, 2023

Related U.S. Application Data

(63) Continuation of application No. 17/650,290, filed on Feb. 8, 2022, now Pat. No. 11,620,564, which is a continuation of application No. 17/149,326, filed on Jan. 14, 2021, now Pat. No. 11,288,589.

(51) Int. Cl.
*G06F 30/327* (2020.01)
*G06F 30/337* (2020.01)
*G06N 10/00* (2022.01)
*G06N 10/20* (2022.01)

(52) U.S. Cl.
CPC .......... *G06N 10/00* (2019.01); *G06F 30/337* (2020.01)

(58) Field of Classification Search
CPC .......... G06N 10/00; G06N 5/01; G06N 10/20; G06F 30/337; G06F 30/327
See application file for complete search history.

(56) References Cited

U.S. PATENT DOCUMENTS 11,373,114 B1 * 6/2022 Naveh ................. G06N 5/01

* cited by examiner

*Primary Examiner* — Nghia M Doan

(57) ABSTRACT

Method, apparatus and product for modeling of quantum circuits and usages thereof. A method comprises obtaining a model of a quantum circuit that comprises a set of decision variables, corresponding domains, and constraints, wherein the set of decision variables comprise gate assignment decision variables that define an assignment of a gate to a qubit in a cycle in the quantum circuit. The method comprises automatically determining a set of valuations for the set of decision variables. The set of valuations are selected from the corresponding domains and satisfy the constraints. Based on the set of valuations the quantum circuit is synthesized.

20 Claims, 3 Drawing Sheets

DAG-BASED CSP QUANTUM CIRCUIT MODELING

CROSS-REFERENCE TO RELATED APPLICATIONS

This application is a continuation of and claims the benefit of U.S. patent application Ser. No. 17/650,290, titled "CSP-BASED QUANTUM CIRCUIT MODELLING", filed Feb. 8, 2022, which is a continuation of U.S. patent application Ser. No. 17/149,326 filed Jan. 14, 2021, titled "QUANTUM CIRCUIT MODELING", now U.S. Pat. No. 11,288,589, all of which are hereby incorporated by reference in their entirety without giving rise to disavowment.

TECHNICAL FIELD

The present disclosure relates to quantum computing in general, and to modeling of quantum circuits, in particular.

BACKGROUND

Quantum computing is a computational paradigm that is fundamentally different from Boolean computing. Boolean computing is based on the manipulation of states, defined by a bit string of "0" and "1". These states are logically altered by fundamental operations, or logical Boolean gates (e.g. NOT, AND, NAND etc.), to perform certain tasks. Quantum computing, on the other hand, is based on the manipulation of quantum states, defined by a complex vector with norm 1. The length of this vector is 2 to the power of the number of qubits—a physical realization of a two-state system. These states are altered by unitary matrices of the appropriate size, namely the vector length squared. Such matrices can be decomposed by a product of matrices, each a tensor product of 2×2 and 4×4 matrices. This in turn allows us to universally program a quantum computer using only 2×2 and 4×4 matrices (and even more specifically, a small set of such matrices will suffice). Using such matrices to control the state of a quantum computer is referred to as "gate level programming".

In quantum software, programming is done at the gate-level or near gate level. Quantum programming software and frameworks, such as Qiskit, CIRQ, Q #, FOREST, braket, silq, all allow user friendly interfaces for gate level programming. Additionally, quite a few building blocks and algorithms exist that perform certain pre-defined functionalities.

Therefore, the state of the art in quantum computing software is designing quantum circuits at the gate level.

BRIEF SUMMARY

One exemplary embodiment of the disclosed subject matter is a method comprising: obtaining a model of a quantum circuit, wherein the model of the quantum circuit comprises a set of decision variables, corresponding domains, and constraints of the set of decision variables, wherein the set of decision variables comprise gate assignment decision variables that define an assignment of a gate to a qubit in a cycle in the quantum circuit; automatically determining a set of valuations for the set of decision variables, wherein the set of valuations are selected from the corresponding domains and satisfy the constraints; and synthesizing the quantum circuit based on the set of valuations.

Another exemplary embodiment of the disclosed subject matter is a non-transitory computer readable medium retaining program instructions, wherein the program instructions are configured, when read, to cause a processor to perform: obtaining a model of a quantum circuit, wherein the model of the quantum circuit comprises a set of decision variables, corresponding domains, and constraints of the set of decision variables, wherein the set of decision variables comprise gate assignment decision variables that define an assignment of a gate to a qubit in a cycle in the quantum circuit; automatically determining a set of valuations for the set of decision variables, wherein the set of valuations are selected from the corresponding domains and satisfy the constraints; and synthesizing the quantum circuit based on the set of valuations.

Yet another exemplary embodiment of the disclosed subject matter is an apparatus comprising a processor and a memory, wherein said processor is configured to perform: obtaining a model of a quantum circuit, wherein the model of the quantum circuit comprises a set of decision variables, corresponding domains, and constraints of the set of decision variables, wherein the set of decision variables comprise gate assignment decision variables that define an assignment of a gate to a qubit in a cycle in the quantum circuit; automatically determining a set of valuations for the set of decision variables, wherein the set of valuations are selected from the corresponding domains and satisfy the constraints; and synthesizing the quantum circuit based on the set of valuations.

Yet another exemplary embodiment of the disclosed subject matter is a quantum circuit embodied in a tangible product, wherein the quantum circuit is synthesized based on a model of the quantum circuit, wherein the model of the quantum circuit comprises a set of decision variables, corresponding domains, and constraints of the set of decision variables, wherein the set of decision variables comprise gate assignment decision variables that define an assignment of a gate to a qubit in a cycle in the quantum circuit, and wherein the quantum circuit is synthesized based on a set of valuations for the set of decision variables, wherein the set of valuations are automatically determined and selected from the corresponding domains, wherein the set of valuations satisfy the constraints.

Yet another exemplary embodiment of the disclosed subject matter is a method comprising: obtaining a model of a quantum circuit, wherein the model of the quantum circuit comprises a set of decision variables, corresponding domains, and constraints of the set of decision variables, wherein the set of decision variables comprise gate assignment decision variables that define an assignment of a gate to a qubit in a cycle in the quantum circuit, providing the model to be utilized for synthesizing the quantum circuit, wherein the quantum circuit is synthesized based on a set of valuations for the set of decision variables, wherein the set of valuations are determined automatically, wherein each valuation of a decision variable is a selected from a domain in the model that corresponds to the decision variable, wherein the set of valuations satisfy the constraints of the model.

Optionally, the quantum circuit is compiled to obtain a compiled circuit; and the compiled circuit is executed on a quantum computer.

Optionally, a type of a target quantum computer on which the quantum circuit is to be executed is determined a hardware-specific constraint may be automatically added to the model, wherein the hardware-specific constraint is a constraint corresponding to the type of the target quantum computer.

Optionally, the set of decision variable comprise a matrix of variables, wherein each column in the matrix represents a cycle, wherein each row in the matrix represents a qubit, wherein the matrix defines gate assignments in the quantum circuit.

Optionally, the set of decision variables comprise a control qubit decision variable whose value marks to which qubit the gate controls are connected to on a cycle.

Optionally, the constraints comprise a first constraint that is applied on a first block in the quantum circuit and a second constraint that is applied on a second block in the quantum circuit, wherein the first and second blocks comprise disjoint subsets of the set of decision variables.

Optionally, the constraints comprise at least one of: a constraint relating to entanglement with a phase; a constraint relating to entanglement without a phase; a depth of the quantum circuit; and a circuit error of the quantum circuit.

Optionally, said obtaining the model comprises generating the model based on a target quantum circuit, wherein the quantum circuit is an approximated quantum circuit that is an approximation of the target quantum circuit, wherein the model comprising an error constraint bounding an approximation error by a threshold.

Optionally, the model comprising a depth constraint constraining a depth of the approximated quantum circuit to be smaller than a depth of the target quantum circuit, wherein the quantum circuit synthesized in said synthesizing has a smaller depth than the depth of the target quantum circuit.

Optionally, said automatically determining the set of valuations for the set of decision variables is performed using a Constraint Satisfaction Problem (CSP) solver, wherein the model is a CSP.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
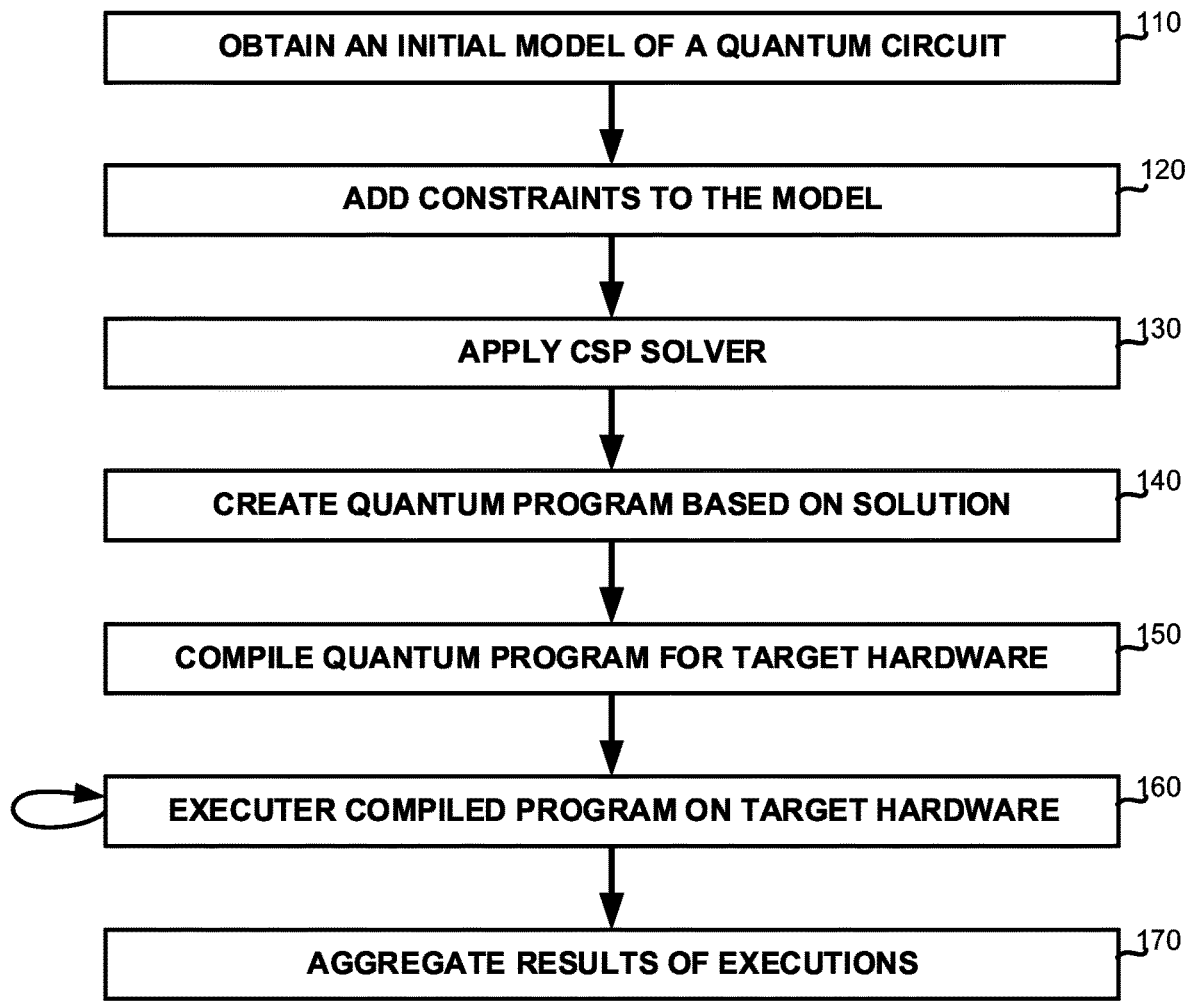
FIG. 1 shows a flowchart diagram of a method, in accordance with some exemplary embodiments of the disclosed subject matter.

One technical problem dealt with by the disclosed subject matter is to enable programming of quantum software at a higher abstraction level than the gate level. It may be desired to provide for a relatively easy method of programming a quantum computer. In some exemplary embodiments, a Computer Aided Design (CAD) technique of programming a quantum computer may be desired so as to enable a programmer to rely on a computer for simplifying the complex task of designing a quantum circuit with desired properties.

Creating Quantum algorithms is generally considered hard. Most people, including skillful programmers, do not know how to create a quantum algorithm for any problem. Very few quantum algorithms exist. As a result, it is very hard to create new quantum algorithm for specific problem. Further, in quantum algorithms, the understanding of physics is very important to the creation of the algorithm. This creates another barrier on manual programming at high abstraction levels.

In some exemplary embodiments, a quantum circuit may be constructed out of layers. Each layer may be a tensor product of a certain fixed set of gates. A circuit may be a matrix, defined by a product of layers $L_1 \cdot L_2 \cdot \ldots \cdot L_d$. The number of layers d may be referred to as the depth of the circuit. In some exemplary embodiments, a circuit over n qubits may be a unitary operator $U_n$.

One technical solution is to provide a modeling of the quantum circuit using a Constraint Satisfaction Problem (CSP) paradigm. Once a modeling is provided, specific constraints may be defined based on desired functionality, hardware constraints, topology and architecture of the quantum circuit, or the like. After the CSP is defined, a CSP solver may be applied to provide a concrete representation that satisfies all the constraints. Based on such solution, a quantum program can be created, compiled and executed on a quantum computer.

Another technical solution is to utilize a CSP modeling for advanced circuit design. In some cases, a theoretical quantum circuit design may be impractical. Using the CSP modeling, an alternative design that adheres to desired circuit properties, such as depth, and which provides an approximation error that is bound by a threshold may be generated automatically. As another example, large scale optimization may be implemented, such as optimization of ran time over space, and vice versa, in the usage of ancillary qubits in the design.

One technical effect of utilizing the disclosed subject matter is to provide a new programming paradigm for the quantum computing environment, in a higher abstraction level than the gate-level. In some cases, non-expert users may be enabled to utilize quantum computing using the provided paradigm without having to comprehend all complexities relating to quantum computing. In some cases, even expert users may benefit from the disclosed subject matter as the task of manually programming quantum software may be considered extremely hard even for such experts.

The disclosed subject matter may provide for one or more technical improvements over any pre-existing technique and any technique that has previously become routine or conventional in the art. Additional technical problems, solutions, and effects may be apparent to a person of ordinary skill in the art in view of the present disclosure.

Referring now to FIG. 1 showing a flowchart diagram of a method, in accordance with some exemplary embodiments of the disclosed subject matter.

On Step 110, an initial model of a Quantum Circuit (QC) may be obtained. In some exemplary embodiments, the model may be a Constraint Satisfaction Problem (CSP) model. The CSP model may comprise a set of decision variables $(x_1, x_2, \ldots, x_n)$, with respective domains $(D_1, D_2, \ldots, D_n)$, such that the value of a decision variable xi is selected from the respective domain, Di. In some exemplary embodiments, the domains may have discrete sets of values, continuous sets of values, or the like, such as but not limited to {1, 2, 3, 4}, [0, 1], integer numbers, real numbers, or the like. The CSP may comprise a list of constraints on the variables. The constraints may be expressed as logical expressions over the decision variables, Boolean expression over the decision variables, or the like, such as but not limited to $x_1 < x_2$, $x_1 + x_2 > 5$, $x_4 = 3 \rightarrow x_5 = 1$ or the like. In some exemplary embodiments, the CSP model may be solved by a satisfying assignment in which a valuation of each decision variable from its respective domain is provided, where all constraints are held. Additionally, or alternatively, the CSP model may comprise a target optimization function. In such a case, a solution to the CSP model may attempt to also provide, in addition to a satisfying assignment holding all constraints, an assignment optimizing (e.g., minimizing, maximizing, or the like), the value of the target function.

A QC can be adapted to the CSP framework in a similar way to the salesman problem It is noted that a QC may be modeled in a plurality of different manners. Naïve modeling of a QC may be inefficient and may present a problem that the CSP solver, having NP computation complexity, may be unable to solve in reasonable time (e.g., minutes, hours, or even days). Hence, care should be taken to the modeling of the QC itself.

In some exemplary embodiments, the quantum circuit may comprise a list of gates or unitary 'operation' done in sequential order. Each decision variable in the model may correspond to an operation to be executed in order. Additional constraints may be added to produce a legal circuit with the required functionality.

It is noted that the model of the QC may be based on a directed cycle graph (DAG) representation of the QC. Vertices in the DAG may represent gates and directed edges may represent qubit dependencies. Additionally or alternatively, the vertices may represent inputs, outputs and operations and edges may represent qubits and bits.

Example 1: QC with a Single Qubit Operations

Some quantum hardware may support unitary operation on a single qubit gate. We exemplify this using the unitary operation $U_3(\theta, \phi, \lambda)$ supported by IBM™ hardware. The $U_3$ operation may have 3 input parameters: theta, phi and lambda. A model comprising up to N operations may be modeled as follows:
Decision Variables:
$x_i \in \{U_3\}$, $i \in \{0 \ldots N\}$—gate assignment in the order 0 to N.
$\theta_i \in [0, 2\pi]$, $i \in \{0 \ldots N\}$—angle assignment for gate i.
$\phi_i \in [0, 2\pi]$, $i \in \{0 \ldots N\}$—second angle assignment for gate i.
$\lambda_i \in [0, 2\pi]$, $i \in \{0 \ldots N\}$—third angle assignment for gate i.
$q_i \in \{1 \ldots k\}$, $i \in \{0 \ldots N\}$—qubit assignment for gate i.

Example 2: Multi-Qubits Operation

In some exemplary embodiments, in order to include a 2-qubits operation additional constraints may be utilized. As an example of a 2-qubits operation, we refer to a controlled not (CX) operation. For the avoidance of doubt other quantum gates may also be referred to such as but not limited to Rx, Ry, Rz, T, S, or the like, and the description relates to CX for clarity of disclosure and without limiting the scope of the disclosed subject matter.

One exemplary modeling may be as follows:
Decision Variables:
$x_i \in \{U_3, CX\}$, $i \in \{0 \ldots N\}$—gate assignment in the order 0 to N.
$\theta_i \in [0, 2\pi]$, $i \in \{0 \ldots N\}$—angle assignment for gate i.
$\phi_i \in [0, 2]$, $i \in \{0 \ldots N\}$—second angle assignment for gate i.
$\lambda_i \in [0, 2\pi]$, $i \in \{0 \ldots N\}$—third angle assignment for gate i.
$q1_i \in \{1 \ldots k\}$, $i \in \{0 \ldots N\}$—qubit assignment for gate i.
$q2_i \in \{0. .k\}$, $i \in \{0 \ldots N\}$—second qubit assignment for gate i.
Constraints:
1. $\forall i, x_i = U_3 \Leftrightarrow q1_i = 0$
2. $\forall i, q1_i \neq q2_i$ In this example, a second assignment qubit decision variable is added. The second assignment variable is active (not zero) for CX gate type (constraint 1). The qubits assignments must be different—$q1_i$ is the target and $q2_i$ is the control qubit (constraint 2).

A satisfying assignment of such model represents a quantum circuit to be built. If the value of a decision variable $q2_i$ is zero, such variable is ignored in the construction of the circuit itself.

In some exemplary embodiments, this format may be generalized for operation on more than two qubits. The order of qubits assignment may define how to apply the operation—for example, a three qubit gate where each input behaves differently, the assignment order [1,2,3] and [1,3,2] may have different functionality.

Example 3: DAG Based Model

A DAG-based modeling may be utilized, in which the decision variables may represent vertices and edges in the DAG, and constraints may ensure desired properties. As an example, consider a DAG representation in which vertices are gated and qubit dependencies are represented by edges.
Decision Variables:
$x_i \in \{U_3, CX\}$, $i \in \{0 \ldots N\}$—gate assignment in up to N gates of the QC.
$\theta_i \in [0, 2\pi]$, $i \in \{0 \ldots N\}$—angle assignment for gate i.
$\phi_i \in [0, 2\pi]$, $i \in \{0 \ldots N\}$—second angle assignment for gate i.
$\lambda_i \in [0, 2\pi]$, $i \in \{0 \ldots N\}$—third angle assignment for gate i.
edge_in$_i \in \{x_0 \ldots x_N\}$, $i \in \{0 \ldots N\}$ and edge_out$_i \in \{x_0 \ldots x_N\}$, $i \in \{0. .M\}$—defining up to M edges (edge_in$_i$, edge_out$_i$).
Constraints:
1. $\forall i$, edge_out$_j = x_k \rightarrow \neg$reachable($x_k$, edge_in$_i$)
2. $\forall i$, $x_i = U_3 \Leftrightarrow \exists j$ edge_out$_j = x_i \wedge \forall_{k \neq j}$edge_out$_k \neq x_i$
3. $\forall i$, $x_i = CX \Leftrightarrow \exists j_1 \wedge j_2$ edge_out$_{j_1} = x_i \wedge$edge_out$_{j_2} = x_i \wedge \forall_{k \neq j_1 \wedge k \neq j_2}$edge_out$_k \neq x_i$ In some exemplary embodiments, a reachable predicate (a,b) may indicate whether b is reachable using one or more edges from vertex a. The first constraint ensures the model is acyclic. The second constraint, ensures a single qubit assignment for a $U_3$ gate, while the third constraint ensures that each CX gate is assigned exactly two qubits.

In some exemplary embodiments, M and N may be based on decision variables enabling to a dynamic size of the model. Additionally or alternatively, some threshold limits may be utilized as M and N. In such a case, the domain of $x_i$ may include a dummy gate, and the domains of the edge_in and edge_out may include dummay values for dummy edges. In some cases, a constraint may ensure that is a dummy value is in one sides of an edge, the other side of the edge is also a dummy value (e.g., $\forall_i$edge_out$_i$=I↔edge_in$_i$=I).

Example 4: Multi-Qubits Operation 2

Additionally, or alternatively, a more compact representation may be used to model multi-qubit operations without the use of additional qubits decision variables ($q_2$, $q_3$, etc.). This way the model is more compact, with fewer variables than the previous modeling. It is noted that the constraints may be relatively more complicated than in the previous modeling, which may increase computation time of the CSP solver (e.g., during constant propagation phases).

Decision Variables:
$x_i \in \{I, U_3, CX\}$, $i \in \{0 \ldots N\}$—gate assignment in the order 0 to N.
$\theta_i \in [0, 2\pi]$, $i \in \{0 \ldots N\}$—angle assignment for gate i.
$\phi_i \in [0, 2\pi]$, $i \in \{1 \ldots N\}$—second angle assignment for gate i.
$\lambda_i \in [0, 2\pi]$, $i \in \{0 \ldots N\}$—third angle assignment for gate i.
$q_i \in \{1 \ldots k\}$, $i \in \{0 \ldots N\}$—qubit assignment for gate i.

Constraints:
1. $\forall i$, $x_i$=CX→($x_{i-1}$=I $\wedge x_{i+1}$=CX$\wedge x_{i+2}$=I)$\vee$($x_{i-2}$=I$\wedge x_{i-1}$=CX$\wedge x_{i+1}$=I)
2. $\forall i$, $x_i$=CX$\wedge x_{i+1}$=CX→$q_i \neq q_{i+1}$ In this modeling, a dummy value (I) is introduced. The dummy value (e.g., identity gate) may be utilized as a separator and may not correspond to any logical functionality. The first constraint ensures that CX gate is assigned in consecutive groups of two, separated by a separator before the group and after the group. The qubit assignment for the first CX gate of the group corresponds to $q_1$ in the previous model, while the second assignment corresponds to $q_2$. The second constraint makes sure that two different qubits are assigned to the gate (e.g., q1≠q2).

Example 5: Block\Cycle

In some exemplary embodiments, the modeling may comprise a block\cycle format. A block may comprise a subset of qubits over a subset of the cycles, and may be aimed at providing a functionality. In some exemplary embodiments, a block may be a vertical cut of the quantum circuit. In the present proposed modeling it is clear how to separate the QC to blocks by addressing a group of cycles. In the previously presented modeling, which utilized linear format, addressing a block may be harder and bug-prone.

In some exemplary embodiments, gate assignment is defined by an array of variables, where each column is a cycle, and each row is a qubit. This facilitates writing constraints between blocks of algorithmic sections.

Decision Variables:
$x_{i,j} \in \{I, U_3, CX\}$, $i \in \{0 \ldots N\}$, $j \in \{1 \ldots k\}$—gate assignment in the i-th cycle, for qubit j.
$\theta_{i,j} \in [0, 2\pi]$, $i \in \{0 \ldots N\}$—angle assignment for cycle i, qubit j.
$\phi_{i,j} \in [0, 2\pi]$, $i \in \{0 \ldots N\}$—second angle assignment for cycle i, qubit j.
$\lambda_{i,j} \in [0, 2\pi]$, $i \in \{0 \ldots N\}$—third angle assignment for cycle i.
control_qubit$_{i,j} \in \{0, \ldots k\}$, $i \in \{0 \ldots N\}$, $j \in \{1 \ldots k\}$—marks to which qubit j the gate controls connected to on cycle i. For example, for CX, control_qubit$_{1,2}$=3 means that on cycle 1 qubit 2 is controlling qubit 3. If the qubit is controlled, the value is set to be zero. In this example, on cycle 1, for qubit 3, the value is 0 (control_qubit$_{1,3}$=0).

Constraints:
1. $\forall i, j$, $x_{i,j}$=CX↔control_qubit$_{i,j} \neq j$ $\wedge$ control_qubit$_{i,j} \neq 0$
2. $\forall i$, $j$ control_qubit$_{i,j} \neq j \rightarrow x_{i,control\_qubit_{i,j}}$=I$\wedge$control_qubit$_{i,control\_qubit_{i,j}}$=0
3. $\forall i$, $\forall m \neq n$ s. t. control_qubit$_{i,m} \neq 0$, control_qubit$_{i,m} \neq$control_qubit$_{i,n}$
4. $\forall i, j$ control_qubit$_{i,j}$=0→exist(control_qubit$_{i,m}$=j)

These constraints may be aimed to ensure that the CX two qubit gate is assigned correctly. Constraint 1 requires that if a CX gate is assigned to a specific qubit, that qubit controls someone (other than itself). Constraint 2 requires that if a qubit controls another qubit, the controlled qubit itself does not have a gate assignment (assigned the dummy gate, I) and that qubit is indicated as controlled by someone else control qubit value assigned to be zero). Constraint 3 is aimed to ensure that the controller qubit is unique, such that no two qubits are controlled by the same qubit. Constraint 4 requires that if a qubit is indicated as being controlled, another qubit will be indicated as controlling it.

In such a modeling, referring to blocks may be relatively easy. Consider the following example. Assume a naïve error model where there is a 2% error chance on CX gates and the designer wants at least 66% success rate on each qubit measurement, meaning that no error occurred for that qubit on any of the gates. Meaning that the total of CX gate allowed on a qubit is 20 ($0.98^{20}$=0.667). The following constraint (denoted constraint 5) may count the number of times a qubit is utilized in a CX gate (either as controlling, and then the relevant $x_{i,j}$ decision variable is set to CX, or as being controlled, and then the control_qubit$_{i,j}$ decision variable is set to zero). Constraint 5 requires that for each qubit, CX gate is applied on the qubit up to 20 times.

5. $\forall j, \Sigma_i 1_{\{x_{i,j}=CX\}} + 1_{\{control\_qubit_{i,j}=0\}} \leq 20$ The circuit may be split into two blocks. The first block may comprise the first M1 cycles and the second block may comprise the last M2 cycles. Different constraints may be applied on the different blocks, including constraints that would allow the size of the blocks to be dynamically set by the CSP solver.

Consider the following example. Assume the circuit first M1 cycles are for preparing a quantum state that can have up to 10% error. Hence, for those M1 cycles, the number of times CX is applied on the qubit is limited to up to 5 times using constraint 6:

6. $\forall j, \Sigma_{i<M1} 1_{\{x_{i,j}=CX\}} + 1_{\{control\_qubit_{i,j}=0\}} \leq 5$ Assume in the last M2 cycles, only 2 phases can be used for some functionality. A constraint such as constraint 7 ensures that such property is held in the last M2 cycles:

7. $\forall j, \Sigma_{i>N-M2} \lambda_{i,j} 0$

The initial model obtained on Step 110 may be obtained from a user, from a repository, from a third-party, or the like. As an example, the user may utilize a human-machine interface (HMI), such as a textual interlace or a graphical interface, to express the constraints on the quantum circuit. For example, the user may be given a textual interface in which the user can write constraints and constraint packages. The constraints may relate to any aspect of the quantum circuit, including but not limited to: number of qubits, number of two-qubit gates, circuit depth (e.g., minimal depth, maximal depth), number of single qubit gates from each type, error metric and error range for some or all qubits, connections between qubits and qubit registers (e.g. two registers must be entangled by some minimal value), specific states the system should be in at specific places in the circuit, or the like. Additionally, or alternatively, the constraints may include functionality constraints indicating that the circuit or sub-circuit needs to perform some specified functionality. For example: Add two registers, entangle some subset of qubits, load some value to a specific register, or the like.

In some exemplary embodiments, quantum related constraints may be provided using a defined language that may abstract some of the implementation details of the model from the user. Consider the following constraints:

1. circuit=QuantumCircuit(qubits_count=4, min_depth=2, max_depth=5)
2, circuit.phase_cx_slide_entangler=PhaseCXSlide,Entangler(uniform, slide_first_control=0, slide_targets=(1, 2), phase=2)
3. circuit.cx_slide_entangler=CXSlideEntangler (slide_first_control=1, slide_targets=(2, 3))

QuantumCircuit, PhaseCXSlideEntangler, CXSlideEntangler are all constructs that are defined in the language performing some specific functionality. In some exemplary embodiments, QuantumCircuit may be a construct that complies to the general quantum circuit constraints, such as depth and number of qubits. Additionally, or alternatively, PhaseCXSlideEntangler may be a construct that creates entanglement between several qubits with a phase. Additionally, or alternatively, CXSlideEntangler may be a construct that creates entanglement between several qubits without a phase. In some exemplary embodiments, each of these constructs may map to a set of constraints on the variables that model the quantum circuit.

On Step 120, additional constraints may be added to the model in an automated manner. The determination of additional constraints may be made depending on the algorithm implemented by the quantum circuit, the hardware being utilized, expected running time, space usage, or the like.

As an example, constraints relating to the usage of ancillary qubits may be introduced to the model. In some exemplary embodiments, an ancillary qubit may be a qubit which start at the zero state, is used for some computation and after the computation it is back to the zero state and disconnected from the rest of the circuit. In some exemplary embodiments, the CSP can also control the use of the use of ancillary qubits and reuse them in a different part of the circuit by keeping a flag var for ancilla usage. A decision variable may be added for each qubit indicating if it is ancilla in each cycle. The CSP constraints can assign value to keep track of this and using this information, gates that require ancilla qubits can select different qubits to be used, or the like. It is noted that in some embodiments, it may be known which are the ancilla qubits by design. However, extrapolating such information by a compiler may require substantive computations, such as executing simulation of the design. The disclosed subject matter may allow for the model to indicate which are the ancillary qubits and enforce efficient usage thereof.

In some exemplary embodiments, global constraints may be introduced to the model, which may be utilized to determine which combination of algorithms implementation are used, the hardware, the running time and space usage, or the like. For example, phase estimation may be implemented using two alternative algorithms. One may be by the use of quantum Fourier transform, while the other uses multiples measurement and offline post processing. The Fourier transform may be faster but may not comply with a desired error score, while the second method is slower, it may be less prone to error. As another example, two alternative implementations of a gate may provide a different space complexity. In some exemplary embodiments, a first implementation may require a number of gates that is linear in the number of qubits but may use ancillary qubits, while the second may require $O(n^2)$ gates but may avoid the use if any ancillary qubits. As yet another example, there may be hardware considerations to the quantum circuit, which may be imported into the model automatically based on the type of the target hardware platform. In some exemplary embodiments, an operation that is not native to the quantum execution platform may get broken to sub-operations, resulting in a different number of gates depending the hardware. The number of gates affect the time it takes to run and error. In some exemplary embodiments, by introducing hardware-related considerations to the design phase, the resulting quantum circuit may be handled better by the compiler, such as by resulting in a compiled circuit that has improved runtime and reduced error rate, with respect to a naïve implementation in which the specific hardware is not considered at all.

On Step 130, a CSP solver may be applied on the model to provide a solution for the CSP. In case no solution is available, an UNSAT indication may be provided and the user may be informed that the requirements cannot be met. If there is a solution available, the CSP solver may provide such solution. It is noted that the CSP solver may utilize different techniques to provide a solution. In some exemplary embodiments, the CSP solver may apply a search on the problem space to determine if a solution exists. In some exemplary embodiments, the CSP solver may apply backtracking, constraint propagation, local search, or the like. In some exemplary embodiments, the CSP solver may implement Very Large-scale Neighborhood Search (VLNS), linear programming, Maintaining Arc Consistency (MAC), or the like.

On Step 140, the solution of the CSP, provided by the CSP solver on Step 130, may be obtained and utilized to synthesize a quantum circuit. The synthesis may be based on the values of the decision variables in the solution, which may define which gates are connected to which qubits and in which cycles, as well as other parameters relevant for the creation of the circuit (e.g., angles related to different gates, controlling qubits, etc.).

On Step 150, the quantum circuit may be compiled by a compiler so as to provide a quantum program that can be executed on a specific type of target execution platform. In some exemplary embodiments, the compiler may predict small-scale functionality and replace it with a better implementation, as part of local optimizations. It is noted that the compiler may be unable to perform large scale optimizations, as such optimizations may require knowledge and understanding of the functionality of the circuit as a whole. It is noted that the same quantum circuit may be compiled to a different implementation for different execution platforms, such as in view of the gates available in the execution platform which are used to implement the functionality of the gates defined in the quantum circuit. Hence, the compiler may create a different quantum circuit having an equivalent functionality to that of the circuit generated on Step 140, potentially varying in performance.

On Step 160, the compiled quantum circuit is executed on the target execution platform, e.g., a target quantum computer. In some exemplary embodiments, the compiled circuit may be executed a plurality of times. On Step 170, the results of the execution(s) may be outputted, such as by providing an output to the user. In some exemplary embodiments, each execution may result in an output state. In some exemplary embodiments, an average or other aggregation may be performed on the plurality of output states. The aggregated state may be considered the output of the execution of the circuit. Additionally or alternatively, a specific state could be of interest without aggregation and may be outputted.

Figure 2:
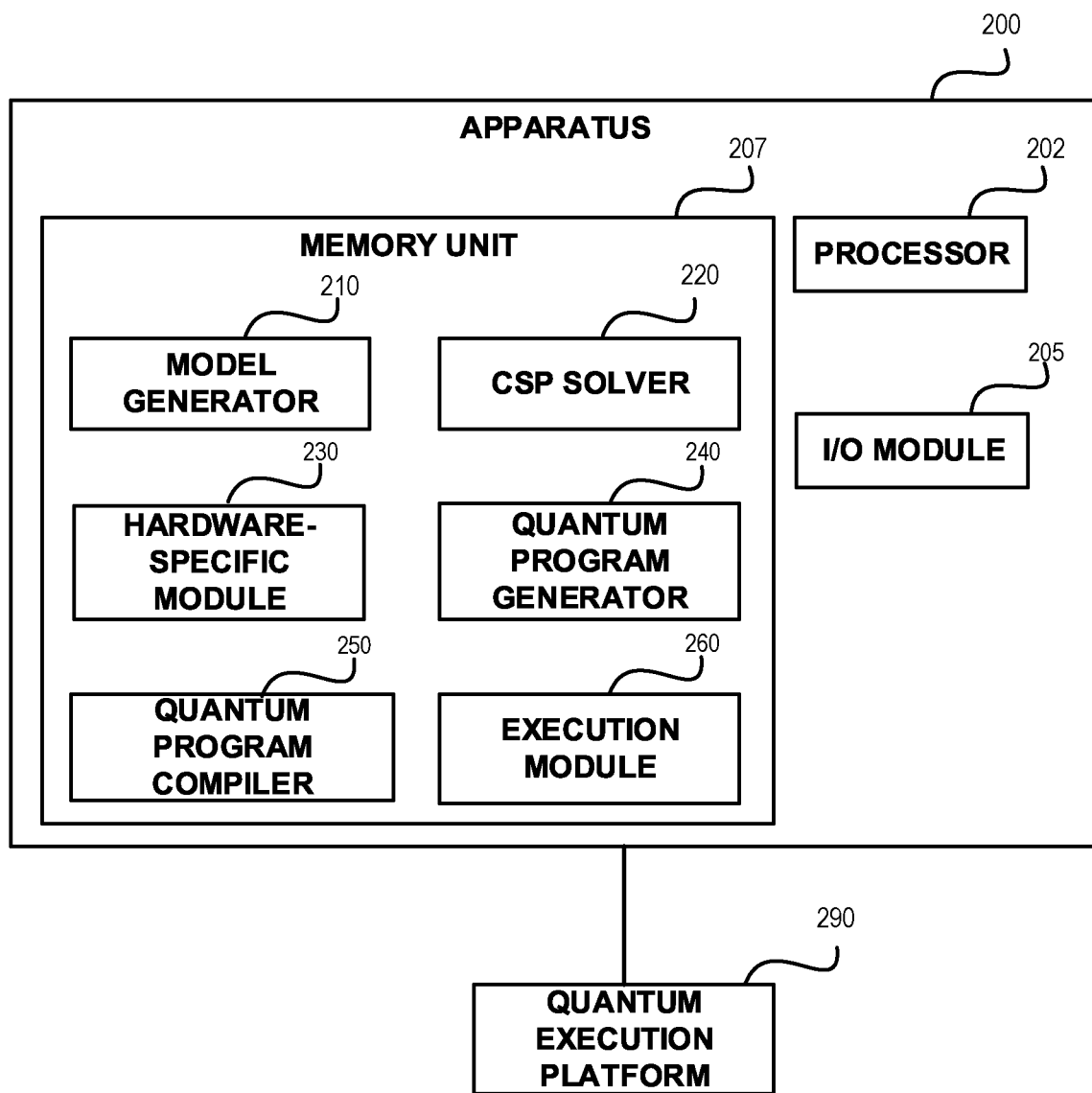
FIG. 2 shows a block diagram of an apparatus, in accordance with some exemplary embodiments of the disclosed subject matter.

Referring now to FIG. 2 showing a block diagram of an apparatus, in accordance with some exemplary embodiments of the disclosed subject matter.

In some exemplary embodiments, Apparatus 200 may comprise one or more Processor(s) 202. Processor 202 may be a Central Processing Unit (CPU), a microprocessor, an electronic circuit, an Integrated Circuit (IC) or the like. Processor 202 may be utilized to perform computations required by Apparatus 200 or any of it subcomponents.

In some exemplary embodiments of the disclosed subject matter, Apparatus 200 may comprise an Input/Output (I/O) module 205. I/O Module 205 may be utilized to provide an output to and receive input from a user, such as, for example to obtain constraints, variables, definitions or the like from the user, from a third party, from an electronic record, or the like, to provide output such as electronic representation of the quantum circuit, a compiled quantum circuit, an output state resulting from the execution of the compiled circuit, an aggregated state of multiple output states resulting from the execution of the compiled circuit, or the like.

In some exemplary embodiments, Apparatus 200 may comprise Memory 207. Memory 207 may be a hard disk drive, a Flash disk, a Random Access Memory (RAM), a memory chip, or the like. In some exemplary embodiments, Memory 207 may retain program code operative to cause Processor 202 to perform acts associated with any of the subcomponents of Apparatus 200.

Memory 207 may comprise one or more components as detailed below, implemented as executables, libraries, static libraries, functions, or any other executable components.

In some exemplary embodiments, Model Generator 210 may be configured to generate a model of a quantum circuit. The model may be a CSP model. In some exemplary embodiments, the model may be generated based on user input, such as explicit instructions, commands, or the like. Additionally or alternatively, the model may be generated based on an initial model that is automatically augmented to introduce additional constraints, decision variables, or the like. In some exemplary embodiments, Hardware-Specific Module 230 may be invoked to add constraints and decision variables to the model based on the quantum execution platform upon which the circuit is to be executed, such as Quantum Execution Platform 290.

In some exemplary embodiments, CSP Solver 220 may be a tool that is capable of providing a satisfying solution to a CSP, optionally, while optimizing a target function, or indicating that such a solution does not exist, CSP Solver 220 may be utilized in Step 130 of FIG. 1.

Quantum Program Generator 240 may be configured to obtain a solution provided by CSP Solver 220 and generate a quantum circuit based thereon. The solution may indicate, for example, which qubits are connected to which gates, and which cycle and various parameters regarding how they are connected. In some cases, the solution may indicate which types of gates are to be employed at each cycle, which qubit is controlling them or controlled by them, or the like. Such information may be utilized to generate a design of the quantum circuit. By Quantum Program Generator 240. In some exemplary embodiments, Quantum Program Generator 240 may be utilized to perform Step 140 of FIG. 1.

Quantum Program Compiler 250 may obtain a quantum circuit, such as generated by Quantum Program Generator 240, and compile a concrete executable program that can be executed on specific quantum computer, such as Quantum Execution Platform 290. Quantum Program Compiler 250 may compile the circuit and modify it to adhere to the target quantum computer its type, available resources, or the like. Additionally or alternatively, Quantum Program Compiler 250 may perform small-scale, local, optimizations to the circuit design, before or after modifying the design to utilize the resources of Quantum Execution Platform 290. In some exemplary embodiments, Quantum Program Compiler 250 may be utilized to perform Step 150 of FIG. 1.

Execution Module 260 may be configured to execute the compiled circuit on the target quantum computer, Quantum Execution Platform 290. In some exemplary embodiments, Execution Module 260 may be configured to execute the program once, and obtain the execution result, such as the output state provided by Quantum Execution Platform 290. Additionally or alternatively, Execution Module 260 may be configured to execute the program a multiple times and obtain multiple output results. The results may then be aggregated together, such as by creating an averaged output state, which may be considered to be the output of the compiled quantum circuit. In some exemplary embodiments, Execution Module 260 may be utilized in performing Steps 160-170 of FIG. 1.

Figure 3:
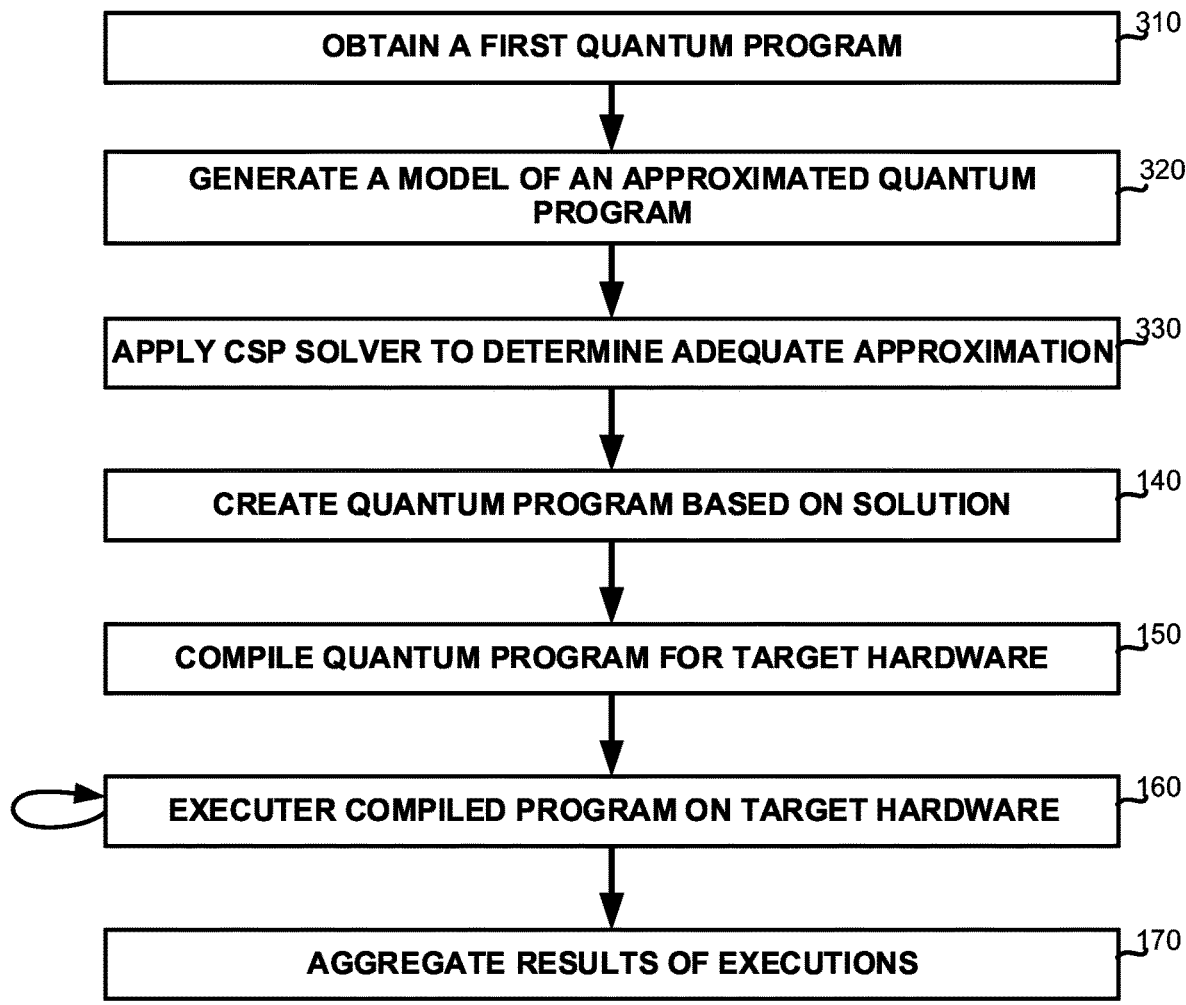
FIG. 3 shows a flowchart diagram of a method, in accordance with some exemplary embodiments of the disclosed subject matter.

Referring now to FIG. 3, showing a flowchart diagram of a method, in accordance with some exemplary embodiments of the disclosed subject matter. FIG. 3 exemplifies a method in which advanced circuit design can be facilitated with CSP modeling by adding interesting properties and constraints about the gate assignment.

On Step 310, a first quantum program is obtained. The obtained quantum program may be provided in a compiled or non-compiled manner. The obtained quantum program may be generated automatically, designed manually, or the like. In some exemplary embodiments, the first quantum program may be an ideal program, which while theoretically correct, cannot be utilized in real life due to some constraints. The first quantum program may be denoted as U. In some exemplary embodiments, U may be a matrix of $2^n \cdot 2^n$. U may be a unitary matrix, a matrix that is if multiplied by a vector with norm of 1, outputs a vector with norm of 1. In some cases, a unitary matrix may be a quantum program, in which unitary operations (gates) are applied on the qubits. Additionally or alternatively, valid quantum state, denoted as $\psi$, may be a vector of size $2^n$ with a norm of 1. The execution of the quantum program may be the multiplication of the state $\psi$ by the unitary matrix U, resulting in an output state.

In some exemplary embodiments, it may be desired to provide an approximated program that adheres to some constraints and has desired properties, while providing an approximated solution within a maximum error threshold.

In some exemplary embodiments, some circuit properties that are of interest in the Noisy Intermediate-Scale Quantum (NISQ) era may be, for example, circuit depth, error, or the like. In some exemplary embodiments, the error may be caused due to decoherence. In some cases, as the circuit is deeper, the error may increase. In some exemplary embodiments, compromise in the circuit design may be desired: instead of using an exact implementation of an operation which using a circuit with large depth, one may use an approximated operation that has less depth but induces approximation error.

On Step 320, a model of the approximated quantum circuit may be obtained. In some cases, the model may be based on an initial model that may be provided by a third party, by a human user, or the like. In some exemplary embodiments, an initial model may be completed and augmented in an automated manner.

In some exemplary embodiments, the model may be a CSP model. In some exemplary embodiments, the CSP model may comprise a decision variable indicating the depth of the design. In some exemplary embodiments, after each gate assignment, the depth lower bound is propagated accordingly. Additionally or alternatively, a constraint creating a maximal bound (e.g., depth<N) may be introduced.

In some exemplary embodiments, the model may comprise a decision variable representing the error, referred to as "error variable". The value of the error variable may be defined using an error metric. The value of the error variable may be calculated on each unitary operation and its implementation. As an example, the error metric may be a linear error metric, but it is noted that the disclosed subject matter is not limited to such implementation. For example, the metric $$E(U, V) = \max_{|\psi\rangle} \|(U * \psi - V * \psi)|\psi\rangle\|$$

is the maximum error for using unitary V (the approximated quantum circuit) instead of the first quantum circuit, unitary U. This metric may satisfy the property of: $E(U_1 U_2, V_1 V_2) \leq E(U_1, V_1) + E(U_2, V_2)$. When such property is held, the value of the error variable can be computed, and a constraint can be introduced to the model to limit the maximal accepted circuit total error. In some exemplary embodiments, the user may introduce constraints on specific blocks of the quantum circuit, such as limiting error in the first block to be no more than a first threshold $T_1$, limiting error in the second block to be no more than a second threshold $T_2$, limiting error in the entire circuit to be no more than $T_3$, or the like.

On Step 330, the model may be solved, using a CSP solver, so as to determine a quantum circuit (V) that adheres to the constraints and which is an adequate approximation of the first quantum circuit (U). Such solution can then be used to generate the quantum program (140), which is compiled (150) and executed (160) to provide results (170).

In some exemplary embodiments, the disclosed subject matter may be employed for generating small gate designs. In some exemplary embodiments, the CSP modeling can be used to design small gate/block, such as a design of up to 10 qubits, 30 qubits, 50 qubits, or the like, that complies with certain properties. As an example, entanglement may be used to various algorithms so a gate which provides a level of entanglement can be useful. In some exemplary embodiments, to implement such circuit with the CSP, a decision variable containing the state vector is needed. The propagation of the state variable is done via a quantum simulator in the propagator of the CSP solver. In some exemplary embodiments, the entanglements between different qubits can be done by connecting them with snot gate and single qubit operation like hadamard gate. The propagator may leave connected qubits untouched while applying operation in the subspace which is not yet connected.

In some exemplary embodiments, benchmarking or testing the quantum circuit hardware may be important for comparing between different hardware execution platforms or for diagnosing if specific execution platform is underperforming. In some exemplary embodiments, random circuits may be a good way to test blindly a quantum hardware, and can be tweaked to perform more intelligent tests if given the hardware architecture. One example is to create random circuits with a certain distribution of unitary gate (e.g., implemented by a constraint on gate count) available to the hardware. This may test if the gate operates correctly when applied in a different setting. Another example may be to stress test a specific area of the hardware by employing complicated operation on the section of interest. Yet another example is to test connectivity between distance qubits by assigning several two qubits gate between them. The specific implementation of the examples is not important. As a result, this allows the CSP to give a wide range of options, making the benchmark more robust.

It is noted that correctness of a large circuit (>50 qubits) can be verified by applying the benchmark circuit and then applying its inverse circuit so that the expected output is the zero state.

In some exemplary embodiments, discovering of ansatz for Variational Quantum Eigensolver (VQE) and Quantum Approximate Optimization Algorithm (QAOA) algorithms may be desired. An ansatz is a parametric quantum circuit. In some exemplary embodiments, the parameters of the ansatz may be tuned classically to reach the desired state at the output of the circuit. It is hard to find a useful ansatz because the search space is large. The CSP engine can help in the search when given simple construction patterns, provided as constraints on the model. The slide entangler is one example of a construction pattern. As an example, the CSP may hold the constraint by using one pattern out of a list of patterns that are known to create entanglement. Another example is that the user can define which entanglement pattern to use explicitly, but the location (cycle) and qubits on which it is applied is selected by the CSP solver. Sometimes this can overlap with other constraints and a single pattern may be used to uphold several constraints, reduce resources needed for another constraint, or the like.

In some exemplary embodiments, a model can constraint the gates to be only between 'n' qubits, that each qubit be used only 'm' times, to limit the depth of the ansatz, the number of parameters used, and more.

Each output ansatz be used in the VQE pr QAOA algorithm to determine if it is useful or not.

In some exemplary embodiments, multi-control gates may have two alternative implementations: the first requires $O(n)$ gates with ancillary qubits, while the second requires $O(n^2)$ gates with no ancillary qubits. In some exemplary embodiments, the model may be held by either implementation, and the CSP solver may choose the implementation that meets all other constraints. In such a manner, the CSP solver can optimize run time over space and vice versa.

Additionally, or alternatively, the CSP can control the use of the use of ancillary qubits and reuse them in a different part of the circuit by keeping a flag var for ancilla usage. An ancillary qubit is a qubit which start at the zero state, is used for some computation and after the computation it is back to the zero state and disconnected from the rest of the circuit. In each gate implementation, each ancilla qubits is known by design. On the other hand, a compiler cannot know without simulation, which is computationally hard. The model may indicate for each qubit whether it is ancilla. A decision variable may be added for each qubit indicating if it is ancilla in each cycle. The CSP constraints can assign value to keep track of this and using this information, gates that require ancilla qubits can select different qubits to be used. When a gate is placed on specific qubits, their respective flags may be indicated as false or true, depending on what role the qubit has in the gate, and whether, by design, the gate defines such qubits as ancilla. As an example, consider a 3 qubit gate which uses 1 ancilla. When such a gate is placed on 4 qubits in the model, the first 3 qubits are marked as false (not ancilla) and the last one is marked as an ancilla. It is noted that the model may require that only a qubit that is a-priori ancilla can be given an ancilla role in a gate. In some exemplary embodiments, all qubits may be initially considered as ancilla as they are initialized to the zero state.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk. C++ or the like, and conventional procedural programming languages, such as the "C" programming language or similar programming languages. The computer readable program instructions may execute entirely on the user's computer, partly on the user's computer, as a stand-alone software package, partly on the uses computer and partly on a remote computer or entirely on the remote computer or server (or a group of multiple remote servers). In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   creating a Constraint Satisfaction Problem (CSP) model of a directed cycle graph (DAG) representation of a quantum circuit, the quantum circuit having up to N gates, the DAG representation comprises vertices and edges, the vertices representing gates in the quantum circuit, edges representing qubit dependencies, the CSP model comprises decision variables, domains thereof and constraint on the values of the decision variables, the decision variables comprise:
      N gate assignment variables ($x_i$) having a domain including a set of one or more alternative types of gates; and
      M pairs of assignment variables defining the edges (edge_in$_i$, edge_out$_i$) each of which having a domain of the N gate assignment variables ($\{x_0 \ldots x_{N-1}\}$);
   automatically solving the CSP model using a CSP solver, wherein said automatically solving comprises determining a set of values for the set of decision variables that hold the constraints of the CSP model, wherein the set of values are selected for each decision variable from the corresponding domain of the decision variable; and
   synthesizing the quantum circuit based on the set of values.

2. The method of claim 1, wherein the constraints comprise a set of acyclic constraints ensuring that the edges do not include a cycle.

3. The method of claim 2, wherein the set of acyclic constraints comprise, for each edge i, edge_out$_i$=$x_k$→¬reachable($x_k$, edge_in$_i$), wherein reachable(a,b) is a predicate indicating whether vertex b is reachable using one or more edges from vertex a.

4. The method of claim 1, wherein the alternative types of gates include at least a gate implementing a single qubit operation, wherein the constraints comprise a set of constraints ensuring that for each vertex representing the gate implementing the single qubit operation there is only a single incoming edge.

5. The method of claim 4, wherein the set of constraints comprise, for each vertex i, a constraint requiring that $x_i$ is assigned the single qubit operation if and only if ∃j edge_out$_j$=$x_i$ ∧∀$_{k\neq j}$ edge_out$_k$≠$x_i$.

6. The method of claim 1, wherein the alternative types of gates include at least a gate implementing a 2-qubit operation, wherein the constraints comprise a set of constraints ensuring that for each vertex representing the gate implementing the 2-qubit operation there are exactly two incoming edges.

7. The method of claim 6, wherein the constraints comprise, for each vertex i, a constraint requiring that $x_i$ is assigned the 2-qubit operation if and only if ∃j$_1$, j$_2$ edge_out$_{j_1}$=$x_i$∧edge_out$_{j_2}$=$x_i$∧∀$_{k\neq j_1 \wedge k\neq j_2}$ edge_out$_k$≠$x_i$.

8. The method of claim 1, wherein M and N are defined by decision variable, thereby enabling a dynamic size of the model.

9. The method of claim 1, wherein the set of one or more alternative types of gates comprise a dummy gate (I), wherein the constraints comprise a constraint ensuring that for each edge i, edge_out$_i$=I↔edge_in$_i$=I.

10. The method of claim 1, wherein the set of one or more alternative types of gates comprise {I, U, CX}, wherein U is a single-qubit operation gate implementing a unitary operation, CX is a 2-qubit operation gate implementing an operation having a gate control, and I is a dummy gate.

11. The method of claim 1, wherein the decision variables further comprise:
   N angle assignment variables ($\theta_i$) having a domain of potential angles;
   N second angle assignment variables ($\phi_i$) having the domain of potential angles; and
   N third angle assignment variables ($\lambda_i$) having the domain of potential angles.

12. The method of claim 1, wherein the constraints comprise an entanglement constraint ensuring a subset of qubits of the quantum circuit are entangled.

13. The method of claim 1 further comprising:
   determining a type of a target quantum computer on which the quantum circuit is to be executed;
   wherein the CSP model comprises a hardware-specific constraint, wherein the hardware-specific constraint is a constraint corresponding to the type of the target quantum computer.

14. The method of claim 1 further comprises:
   compiling the quantum circuit to obtain a compiled circuit; and
   executing the compiled circuit on a quantum computer.

15. A system comprising:
   a model generator that is operable, when executed by a processor, to create a Constraint Satisfaction Problem (CSP) model of a directed cycle graph (DAG) representation of a quantum circuit, the quantum circuit having up to N gates, the DAG representation comprises vertices and edges, the vertices representing gates in the quantum circuit, edges representing qubit dependencies, the CSP model comprises decision variables, domains thereof and constraints on the values of the decision variables, the decision variables comprise:
      N gate assignment variables ($x_i$) having a domain including a set of one or more alternative types of gates; and
      M pairs of assignment variables defining the edges (edge_in$_i$, edge_out$_i$) each of which having a domain of the N gate assignment variables ($\{x_0 \ldots x_{N-1}\}$);
   a CSP solver that is operable, when executed by a processor, to automatically solve the CSP model thereby providing a set of values for the set of decision variables that hold the constraints of the CSP model, the set of values are selected for each decision variable from the corresponding domain of the decision variable; and a quantum circuit generator that is operable, when executed by a processor, may be configured to generate a quantum circuit based on the set of values provided by the CSP solver.

16. The system of claim 15, wherein the processor is a classic processor.

17. The system of claim 15 further comprising a execution module for executing the quantum circuit on a quantum execution platform.

18. The system of claim 15,
wherein the alternative types of gates include at least a gate type implementing a single qubit operation and a gate type implementing a 2-qubit operation,
wherein the constraints comprise a set of constraints ensuring that for each vertex representing the gate type implementing the single qubit operation there is only a single incoming edge; and
wherein the constraints comprise a set of constraints ensuring that for each vertex representing the gate type implementing the 2-qubit operation there are exactly two incoming edges.

19. The system of claim 15, wherein the set of one or more alternative types of gates comprise a dummy gate (I), wherein the constraints comprise a constraint ensuring that for each edge i, edge_out$_i$=I$\leftrightarrow$edge_in$_i$=I.

20. A quantum circuit embodied in a tangible product,
wherein the quantum circuit is synthesized based on a Constraint Satisfaction Problem (CSP) model of a directed cycle graph (DAG) representation of a quantum circuit, the quantum circuit having up to N gates, the DAG representation comprises vertices and edges, the vertices representing gates in the quantum circuit, edges representing qubit dependencies, the CSP model comprises decision variables, domains thereof and constraints on the values of the decision variables, the decision variables comprise:
N gate assignment variables ($x_i$) having a domain including a set of one or more alternative types of gates; and
M pairs of assignment variables defining the edges (edge_in$_i$, edge_out$_i$) each of which having a domain of the N gate assignment variables ($\{x_0 \ldots x_{N-1}\}$);
wherein the quantum circuit is synthesized based on an automatic solution of the CSP model, wherein the solution of the CSP model comprise a set of values for the set of decision variables that hold the constraints, wherein the set of values are values selected for each decision variable from the corresponding domain of the decision variable.

\* \* \* \* \*